US010388540B2

(12) United States Patent
Brunschwiler et al.

(10) Patent No.: US 10,388,540 B2
(45) Date of Patent: Aug. 20, 2019

(54) HIGH-PERFORMANCE COMPLIANT HEAT-EXCHANGER COMPRISING VAPOR CHAMBER

(71) Applicant: International Business Machines Corporation, Armonk, NY (US)

(72) Inventors: Thomas Brunschwiler, Thalwil (CH); Ingmar Meijer, Zurich (CH); Stephan Paredes, Zurich (CH); Gerd Schlottig, Uitikon Waldegg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/456,807

(22) Filed: Mar. 13, 2017

(65) Prior Publication Data

US 2018/0261522 A1 Sep. 13, 2018

(51) Int. Cl.

*H01L 21/48* (2006.01)
*H01L 23/373* (2006.01)
*H01L 23/427* (2006.01)

(52) U.S. Cl.

CPC ...... *H01L 21/4882* (2013.01); *H01L 23/3736* (2013.01); *H01L 23/427* (2013.01)

(58) Field of Classification Search

CPC ............................ H01L 23/3675; H01L 23/42
See application file for complete search history.

(56) References Cited

U.S. PATENT DOCUMENTS

| | | | | | |
|---|---|---|---|---|---|
| 4,474,170 | A * | 10/1984 | McConnell | F28D 15/046 126/636 |
| 5,325,913 | A * | 7/1994 | Altoz | F28D 15/04 165/287 |
| 2004/0118579 | A1* | 6/2004 | McCutcheon | F28D 15/0241 174/16.3 |
| 2004/0262852 | A1* | 12/2004 | Vafai | B01J 19/0093 277/628 |
| 2009/0151906 | A1* | 6/2009 | Lai | F28D 15/046 165/104.26 |
| 2012/0170221 | A1 | 7/2012 | Mok | |
| 2013/0199767 | A1* | 8/2013 | Karidis | H01L 24/72 165/185 |

* cited by examiner

*Primary Examiner* — Eliseo Ramos Feliciano
*Assistant Examiner* — Christina A Sylvia
(74) *Attorney, Agent, or Firm* — Harrington & Smith

(57) ABSTRACT

This invention relates to cooling devices for multi-chip semiconductor devices, system-on-a-package devices, and other packaged devices. Because of the non-uniform height across the surface in such large-chip and multi-chip assemblies, providing heat exchange can be troublesome. Many air cooled heat sinks are too stiff to adapt to such non-uniform or warped shapes of chips or to shape-changing chip surfaces during operation. In the present disclosure, application of a mechanical load perpendicular to the chip plane causes certain features to flex and adapt to the non-uniform height of the chip plane, providing improved heat exchange.

15 Claims, 19 Drawing Sheets

HIGH-PERFORMANCE COMPLIANT HEAT-EXCHANGER COMPRISING VAPOR CHAMBER

FIELD OF TECHNOLOGY

The present invention relates to the technical field of heat exchange. More specifically, the present invention relates to a heat exchanger with a vapor chamber.

BACKGROUND OF THE INVENTION

Heat exchange is important to ensure devices remain within acceptable operational parameters as well as to achieve efficient thermodynamic operation. A great deal of effort has been directed toward improving thermodynamic efficiency in chip package heat exchangers. As such, numerous heat exchange systems have been developed for removing heat in a uniform, single chip package.

However, modular packages, which include a number of integrated circuit chips, have become more prevalent in the electronics industry. The chips within a module may be structurally equivalent, such as an array of similar memory chips. Alternatively, the chips may be structurally different, such as a set of chips consisting of a read only memory chip, a random access memory chip, a microprocessor and an interface chip.

One issue with multi-chip modules is the increased density of the chips on the package. This confinement within a single area increases the need for high performance cooling. Previously, the use of a liquid coolant that is forced to flow through a multi-chip module to absorb thermal energy, where the liquid coolant is removed from the module at an outlet port, has been shown. While, a liquid coolant loop through a module is an effective way of ensuring adequate cooling, it is an expensive cooling method that requires a mechanism for providing a forced flow of liquid coolant.

For applications in which forced liquid cooling is impractical, heat spreaders, or sinks, are used to dissipate thermal energy. For packages that generate a significant amount of thermal energy, the thermal path from the chips to the exterior of the heat spreader is of particular importance. It is often desired that contact be made between the integrated circuit chips and the structure that begins the thermal path to the sink. However, large-chip and multi-chip assemblies have a non-uniform height across their area. During the fabrication of these assemblies, there will be differences among the modules and even among the various chips within a single module. For example, chips are often encased within a carrier before being mounted to a substrate. The carriers may have slight differences in height and/or the mounting of the chips to the substrate may result in slight variations in height or angle with respect to the component surface of the substrate. Various fabrication and machine tolerances are additive, so that the chips within a multi-chip module will not have a planar surfaces across all chips.

Ensuring adequate contact between individual chips and a heat dissipating structure is difficult in many applications. Available air-cooled heat sinks are too stiff to adapt to such non-uniform or warped shapes of chips or to shape-changing chip surfaces during operation. Lidded packages allow to flatten warped assemblies and to adapt lids to multi-chip topologies, both within the manufacturing environment (clean, controlled). The thermal spreading of the lid renders the package tolerant to non-uniformity of heat sink attachments. Lids create an additional thermal resistance and therefore perform poorer than direct-attached heat sinks.

Also, there are no compliantly attached lids available. Thus, the thermal envelope of operating the chips using the current state-of-the-art is limited.

What is needed is an apparatus that can provide a heat transfer interface in packages containing non-uniform chip assemblies.

SUMMARY OF INVENTION

In this disclosure, embodiments of a compliant air heat exchanger are taught. The heat exchanger combines two features: (1) an element that provides mechanical compliance, and (2) a functionality that provides good thermal performance. The compliant air heat exchanger comprises, in embodiments, at least one flexible element such as a membrane or a thinned area. The internal geometry allows for at least one cavity that can act as vapor chambers, at logical positions, in the base plate.

The present invention relates to the use of compliant air heat sinks. By using a compliant air heat sink, large-chip and multi-chip assemblies can now be thermally attached with a thin and uniform bondline thickness throughout their full area, despite their non-uniform height across their area. Therefore, the thermal envelope of operating the chips is substantially improved (relaxed air inlet temperature specification and/or reduced junction temperature).

The present invention further relates to a compliant air heat sink that creates no additional thermal resistance and therefore perform superior to lid-attached heat sinks. Embodiments of the compliant air heat sink can be used in many or all air cooled systems.

The present invention relates to a compliant air heat sink with simpler construction. Embodiments of the compliant air heat sink provide for fewer assembly steps, e.g., no TIM2, no lid, no capping. The compliant air heat sink can be attached with a lower pressure, and failure modes are relaxed.

In embodiments, an apparatus for heat exchange comprises a base plate, a first flexible element connected to the base plate, an inflexible element connected to the flexible element, and at least one cavity, where the at least one cavity is confined by the flexible element, the inflexible element, and the base plate.

In alternative embodiments, the apparatus may further comprise a second flexible element connected to the base plate. In an optional embodiment, the inflexible element can be connected to the second flexible element by a bonding element. In other optional embodiments, the inflexible element comprises a block, the cavity is sealed, and the cavity contains a fluid. In embodiments, the fluid is selected from the group consisting of acetone, hexane-n, ethanol, methanol, isopropyl alcohol, n-propyl alcohol, cyclohexane, acetaldehyde, diethyl ether, and pentane-n. In an optional embodiment, the inflexible element is connected to the first flexible element by a bonding element. In a preferred embodiment, a surface of a wall of the at least one cavity is enlarged in surface area, such as from a roughened surface. In a preferred embodiment, at least one fin structure is connected to the base plate. In a further preferred embodiment, at least one pin structure connected to the base plate.

Numerous other embodiments are described throughout herein. All of these embodiments are intended to be within the scope of the invention herein disclosed. Although various embodiments are described herein, it is to be understood that not necessarily all objects, advantages, features or concepts need to be achieved in accordance with any particular embodiment. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

The methods and systems disclosed herein may be implemented in any means for achieving various aspects, and may be executed in a form of a machine-readable medium embodying a set of instructions that, when executed by a machine, cause the machine to perform any of the operations disclosed herein. These and other features, aspects, and advantages of the present invention will become readily apparent to those skilled in the art and understood with reference to the following description, appended claims, and accompanying figures, the invention not being limited to any particular disclosed embodiment(s).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and the invention may admit to other equally effective embodiments.

DETAILED DESCRIPTION OF THE EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention. Electrical, mechanical, logical and structural changes may be made to the embodiments without departing from the spirit and scope of the present teachings. The following detailed description is therefore not to be taken in a limiting sense, and the scope of the present disclosure is defined by the appended claims and their equivalents.

Upon application of a mechanical load perpendicular to the chip plane, the load flowing through the heat sink body, the flexible feature flexes, and thereby adapts to the non-uniform height of the chip plane, in other words compliantly adapts to its shape.

The cavity, filled with a fluid that evaporates in the working temperature range (depending on application between 50 to 120° C., one may use, for example, Acetone, Hexane-n, ethanol or methanol, Isopropyl, n-propyl alcohol, Cyclohexane, or possibly a solution thereof. For applications at lower temperatures, between 20 and 40° C., one may use for example, Acetaldehyde, Diethyl ether, or Pentane-n, or possibly a solution thereof, which substantially reduces the thermal resistance from chip surface to air flow by use of latent heat upon evaporation of the liquid on the inner cavity surface closest to the chip. When reaching the coolest inner surface of the cavity, the vapor condenses and, in turn, becomes available for evaporation that is for heat transfer.

Figure 18:
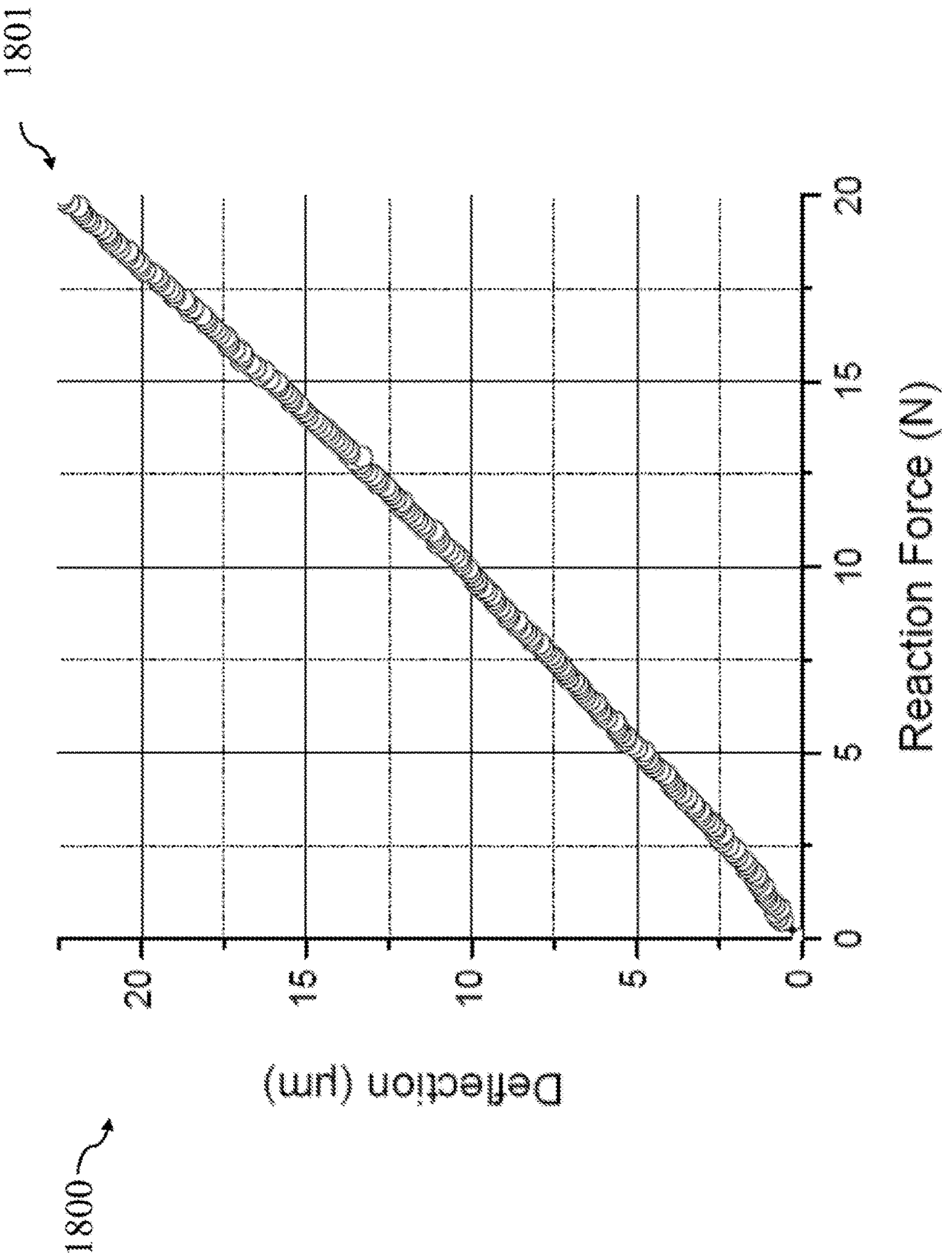
FIG. 18 shows a plot of the measured deflection behavior in an embodiment of the present invention.

To measure the deflection behavior, the fabricated demonstrator was subjected to a central force load. The plot shown in FIG. 18 shows a calibrated deflection curve. For a typical LGA activation load of 2000 N, the realized membrane area (370 $mm^2$) receives thereof a share of 160 N. Under this load the 300 μm thick membrane deflects about 200 μm, which is in the relevant range of applications.

Figure 1:
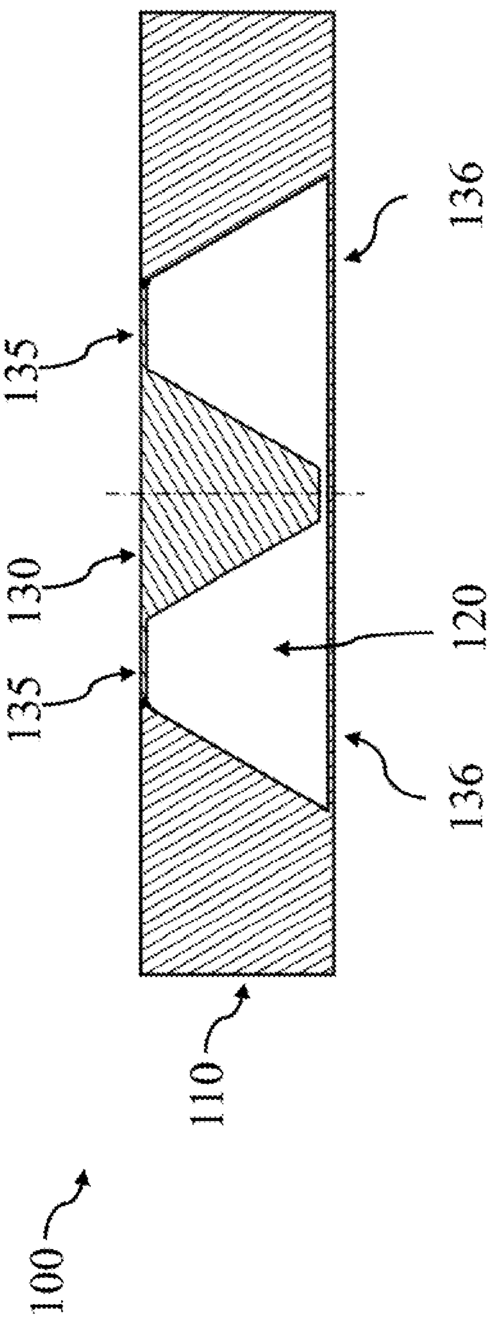
FIG. 1 illustrates a cross-section view of a heat exchanger, according to an embodiment of the present invention.

FIG. 1 illustrates a cross-section view of a heat exchanger 100, according to an embodiment of the present invention. An inflexible element 130 is connected to a base plate 110 by a first flexible element 135. A second flexible element 136 is attached to the base plate 110. The combination of the base plate 110 with the inflexible element 130 and the flexible elements 135, 136 creates a cavity 120 (or chamber). The heat exchanger can be constructed such that the device has rotational symmetry. Generally, unless otherwise indicated, the flexible elements, inflexible elements, and base plates described below with reference to the figures may be made of thermal conductor materials, such as copper and its alloys, aluminum and its alloys, or titanium and its alloys. The materials may differ, as long as the fabrication process allows (for instance brazing or soldering compatible). The connections between the flexible elements, inflexible elements, and base plates can be made with a bonding element, such as solder or other connecting material or means. In the embodiment of FIG. 1, the inflexible element 130 does not touch the second flexible element 136.

The inflexible element 130 is connected to at least one flexible element, and, at least partially, spans the height of the base plate 110. There are two alternative ways of how thermal performance is achieved. First, the inflexible element 130 can be initially disconnected to the second flexible element 136, but touches it upon actuation due to a position change of one of the flexible elements 135, 136. Second, the inflexible element 130 can be connected to both flexible elements 135, 136 already in the initial stage without actuation.

The inflexible element 130 can be any of a number of shapes. The inflexible element 130 can be a block, a cylinder, a cone, a dome, a pyramid, or a prism, in various embodiments.

Figure 2:
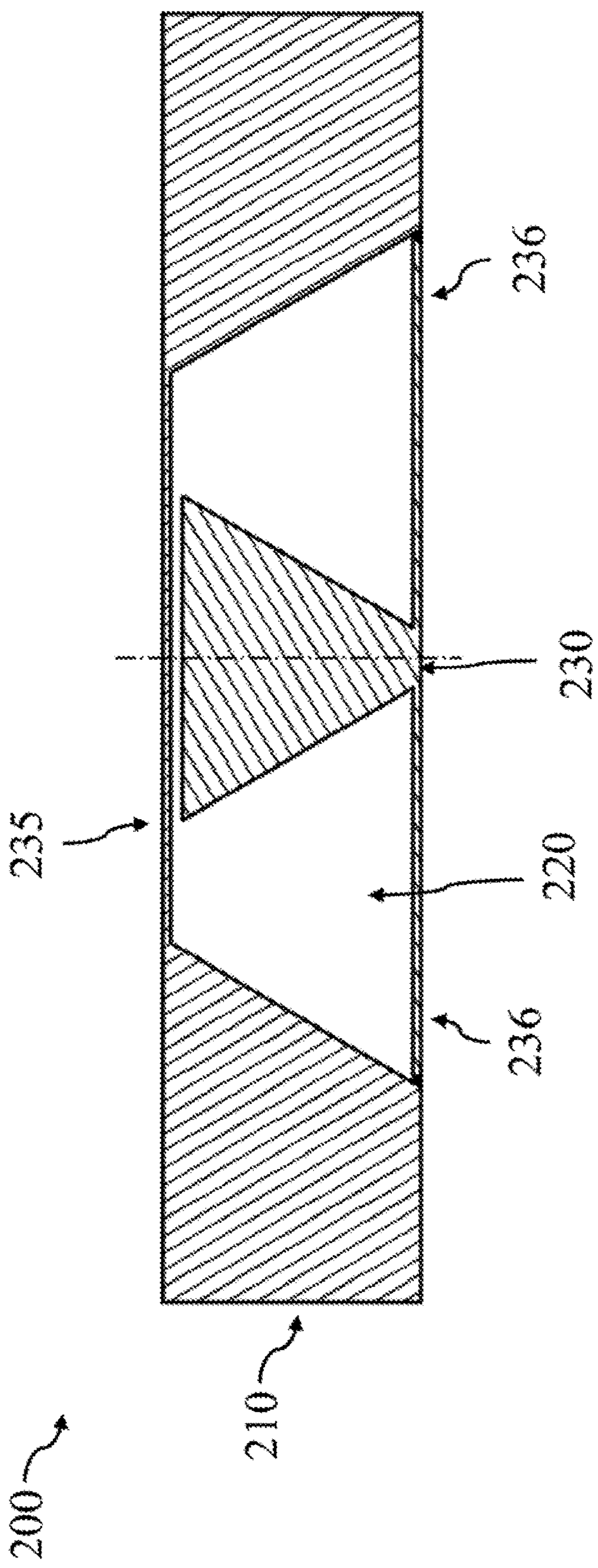
FIG. 2 illustrates a cross-section view of a heat exchanger with a top encompassing base plate, according to an embodiment of the present invention.

FIG. 2 illustrates a cross-section view of a heat exchanger 200 with a top encompassing base plate, according to an embodiment of the present invention. The inflexible element 230 is connected to the base plate 210 by a first flexible element 235 and a second flexible element 236. The inflexible element 230 does not touch the first flexible element 235. The combination of the base plate 210 with the inflexible element 230 and the flexible elements 235, 236 creates a cavity 220 (or chamber). The heat exchanger 200 can be constructed such that the device is symmetrical in cross-sections by rotation.

Figure 3:
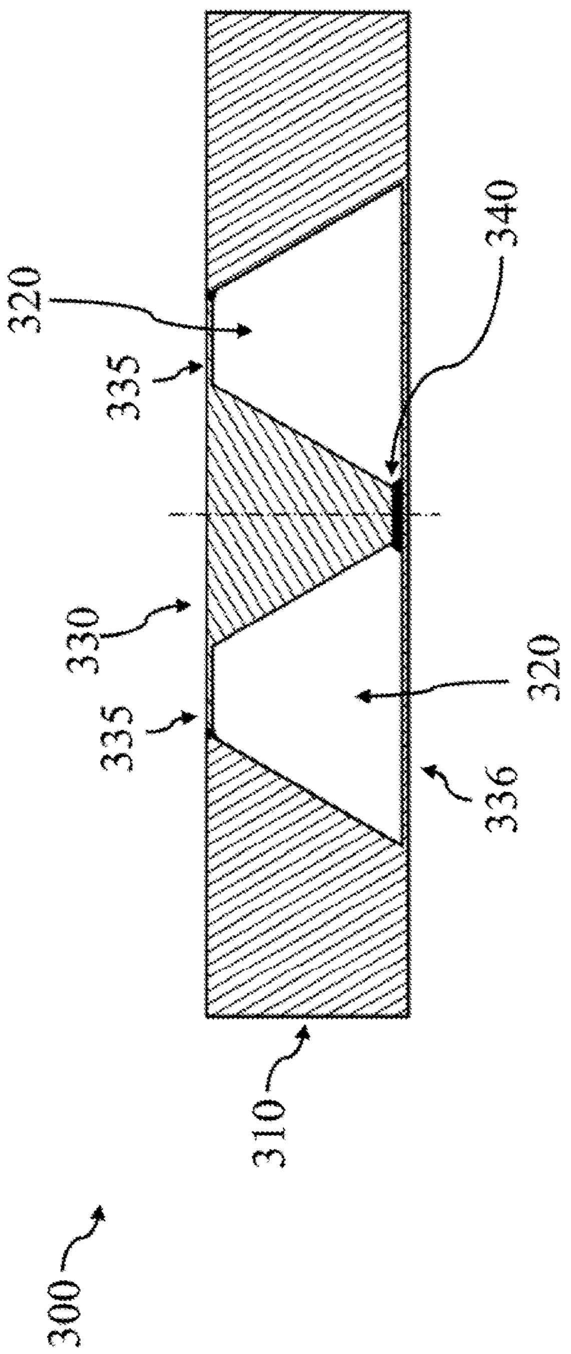
FIG. 3 illustrates a cross-section view of a heat exchanger with joint connecting material, according to an embodiment of the present invention.

FIG. 3 illustrates a cross-section view of a heat exchanger 300 with joint connecting material, according to an embodiment of the present invention. The device is similar to the heat exchanger 100 of FIG. 1 with base plate 310, inflexible element 330, first flexible element 335, second flexible element 336, and a cavity 320. However, in this embodiment, a bonding element 340 is added to connect the inflexible element 330 to the second flexible element 336. Because of the rotational symmetry, a single cavity 320 is formed.

Figure 4:
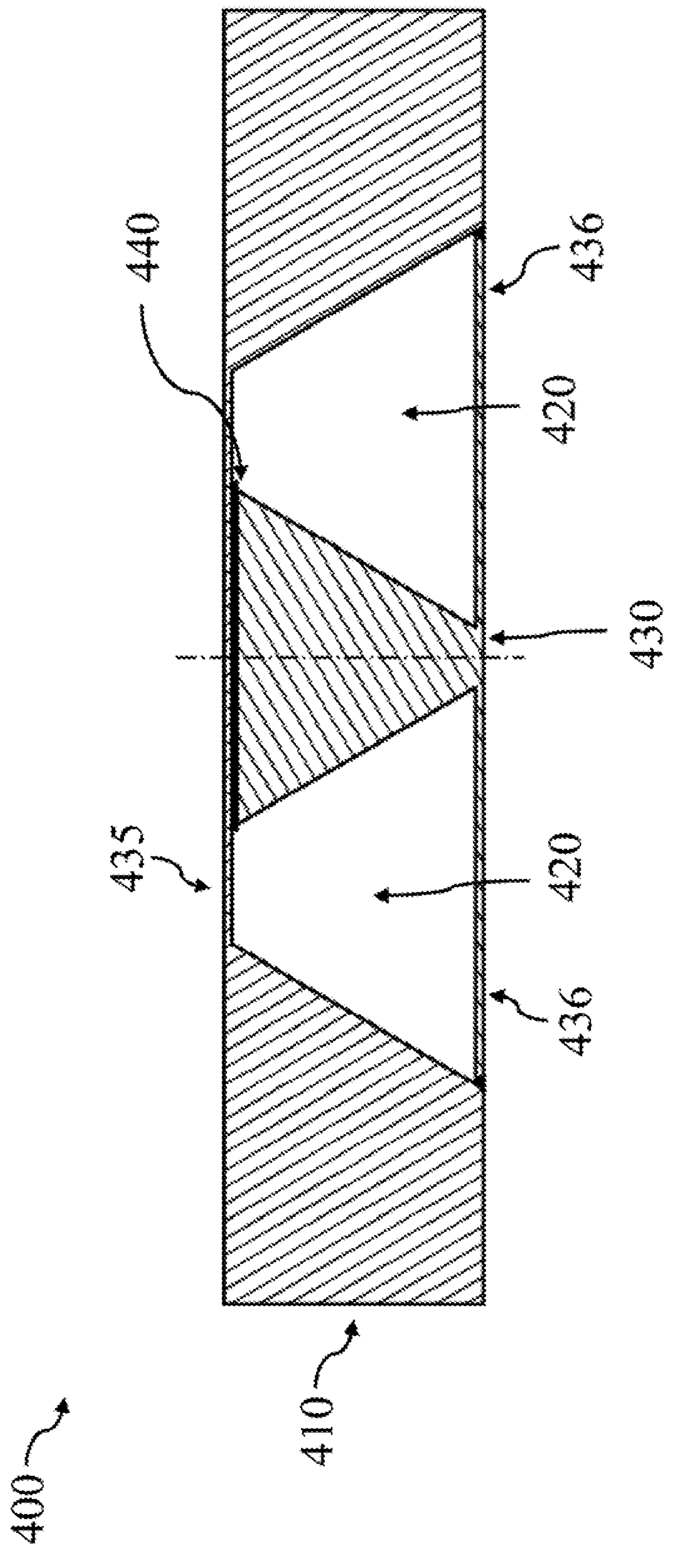
FIG. 4 illustrates a cross-section view of a heat exchanger with joint connecting material, according to an embodiment of the present invention.

FIG. 4 illustrates a cross-section view of a heat exchanger 400 with joint connecting material, according to an embodiment of the present invention. The device is similar to the heat exchanger 200 of FIG. 2 with base plate 410, inflexible element 430, first flexible elements 435, second flexible element 436, and cavity 420. However, in this embodiment, a bonding element 440 is added to connect the inflexible element 430 to the first flexible element 435.

Figure 5A:
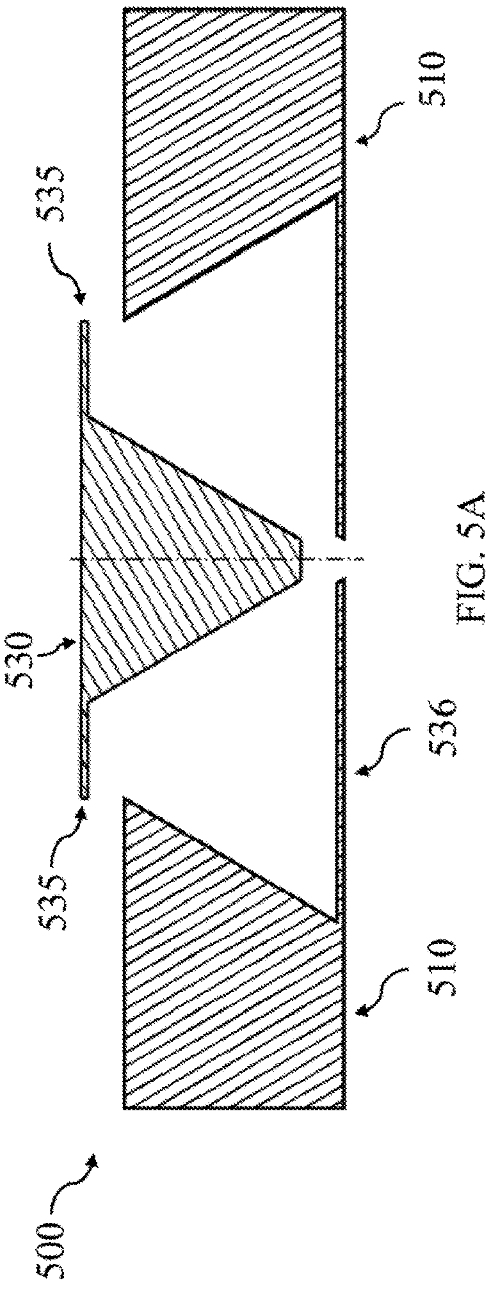
FIG. 5A illustrates a cross-section view of a heat exchanger with components separated, according to an embodiment of the present invention.
Figure 5B:
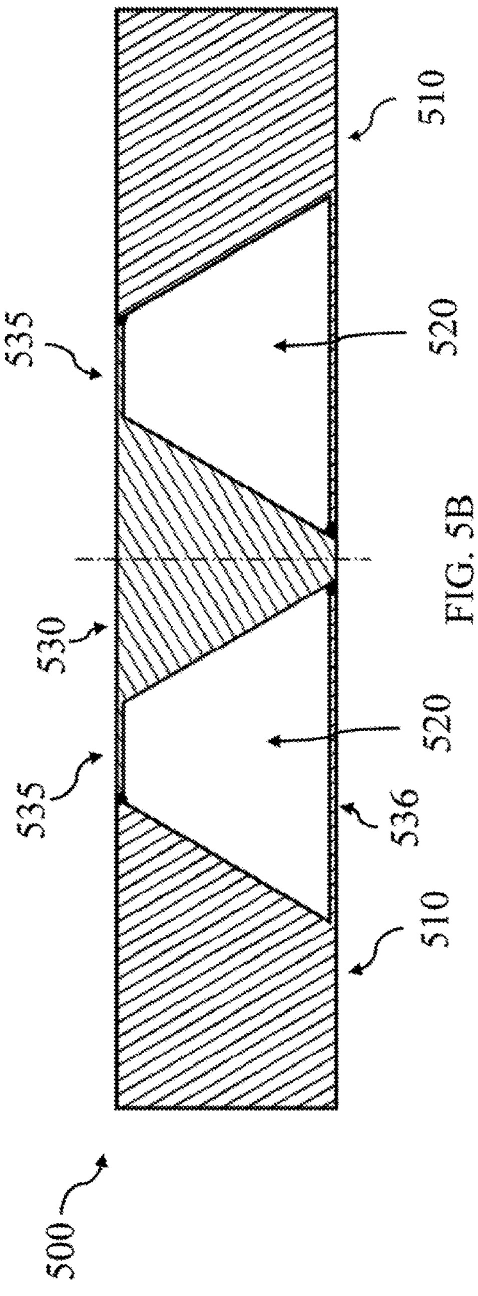
FIG. 5B illustrates a cross-section view of a heat exchanger with components combined, according to an embodiment of the present invention.

FIG. 5A illustrates a cross-section view of a heat exchanger 500 with components separated, according to an embodiment of the present invention. FIG. 5A and FIG. 5B show a manner of constructing the heat exchanger 500. The inflexible element 530, and the base plate 510 are initially separated. A first flexible element 535 is connected to the inflexible element 530, a second flexible element 536 is connected to the base plate 510. The base plate 510 includes a center bore in the flexible element 536. The base plate 510 the inflexible element 530 and the flexible elements 535, 536, creates a cavity 520 when combined, as shown in FIG. 5B.

FIG. 5B illustrates a cross-section view of a heat exchanger 500 with the components combined, according to an embodiment of the present invention. Here, the inflexible element 530 has been attached to the second flexible element 536 at the bottom, and the base plate 510 has been attached to the first inflexible element 535 at the top. These connections can be made with a bonding element, such as solder or other connecting material or means.

Figure 6A:
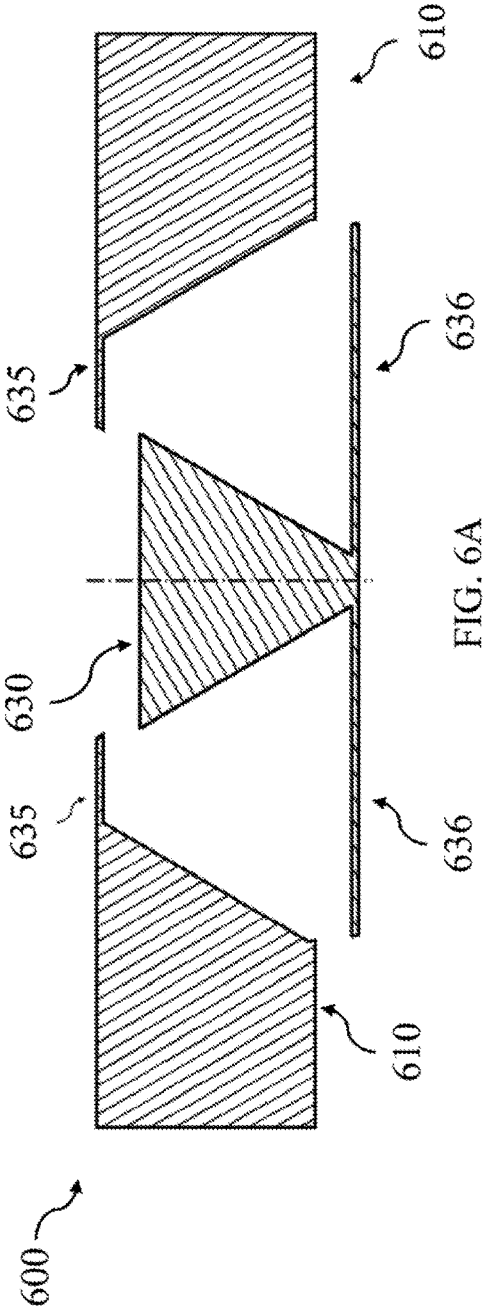
FIG. 6A illustrates a cross-section view of a heat exchanger with components separated, according to an embodiment of the present invention.
Figure 6B:
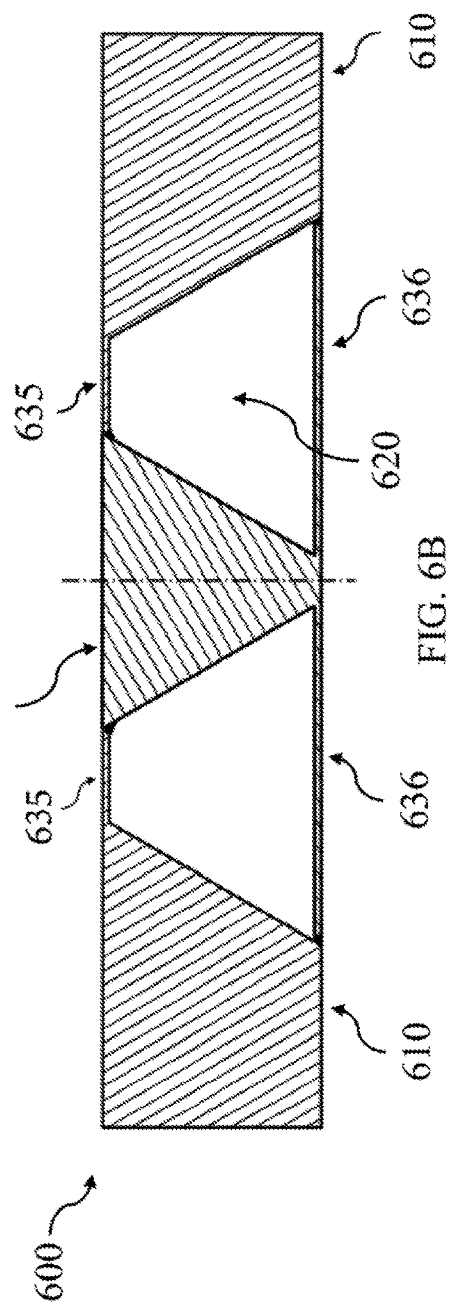
FIG. 6B illustrates a cross-section view of an alternate construction of a heat exchanger with components combined, according to an embodiment of the present invention.

FIG. 6A illustrates a cross-section view of an alternate construction of a heat exchanger 600 with components separated, according to an embodiment of the present invention. FIG. 6A and FIG. 6B show a manner of constructing the heat exchanger 600. The inflexible element 630 and base plate 610 are initially separated. A second flexible element 636 is connected to the inflexible element 630, and a first flexible element 635 is attached to the base plate 610. In this example, the base plate 610 includes a center bore in the flexible element 635.

FIG. 6B illustrates a cross-section view of an alternate construction of a heat exchanger 600 where the components have been combined, according to an embodiment of the present invention. The combination of the base plate 610, the inflexible element 630 and first flexible element 635 creates a cavity 620. There is a single cavity due to the rotational symmetry of the device. The first flexible element 635 has been attached to the inflexible element 630 at the top of the heat exchanger 600. The second flexible element 636 has been attached to the base plate 610 at the bottom of heat exchanger 600. These connections can be made with a bonding element, such as solder or other connecting material or means. Likewise, the base plate 611 is connected to the second flexible element 636 at the bottom with similar connections.

Figure 7A:
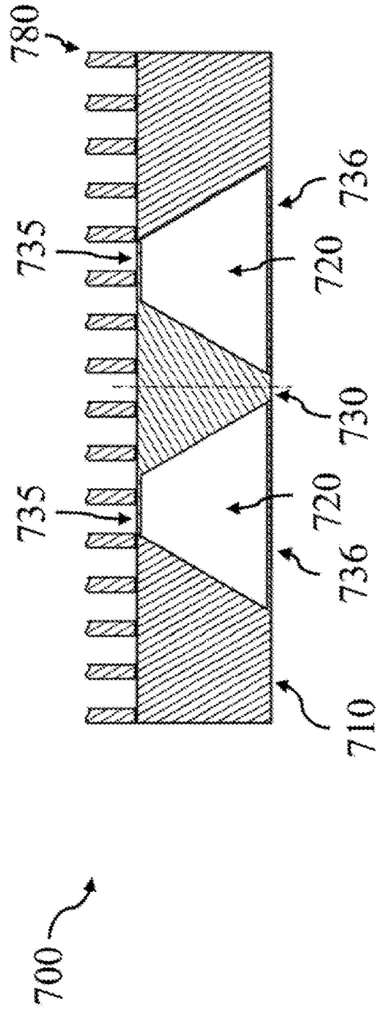
FIG. 7A illustrates a cross-section view of an alternate construction of a heat exchanger with fins, according to an embodiment of the present invention.

FIG. 7A illustrates a cross-section view of a heat exchanger with fins, according to an embodiment of the present invention. The heat exchanger 700 comprises a base plate 710, an inflexible element 730 with first flexible element 735 and second flexible element 736. The combined elements create a cavity 720. In addition, fins 780 are attached to the device to increase surface area. FIG. 7A may also illustrate a cross-section view of a heat exchanger in which pins 780 are attached to the device.

Figure 7B:
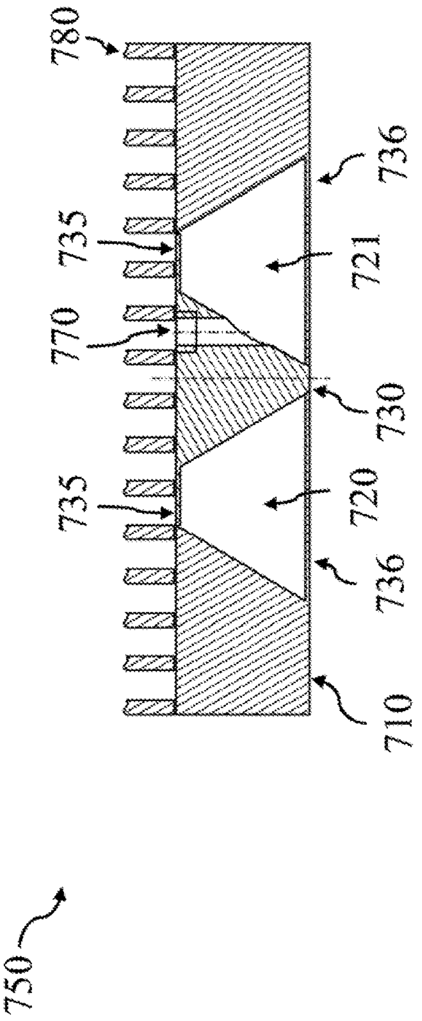
FIG. 7B illustrates a cross-section view of a heat exchanger with fins and an access hole, according to an embodiment of the present invention.

FIG. 7B illustrates a cross-section view of a heat exchanger 750 with fins 780 and an access hole 770, according to an embodiment of the present invention. Again, the heat exchanger 750 comprises a base plate 710, an inflexible element 730 with first flexible element 735 and second flexible element 736. The combined elements create a cavity 720 and a cavity 721. In addition, fins 780 are attached to the device to increase surface area. In the example shown in FIG. 7B, the access hole 770 allows vapor to escape the cavity 721 or chamber.

Figure 8A:
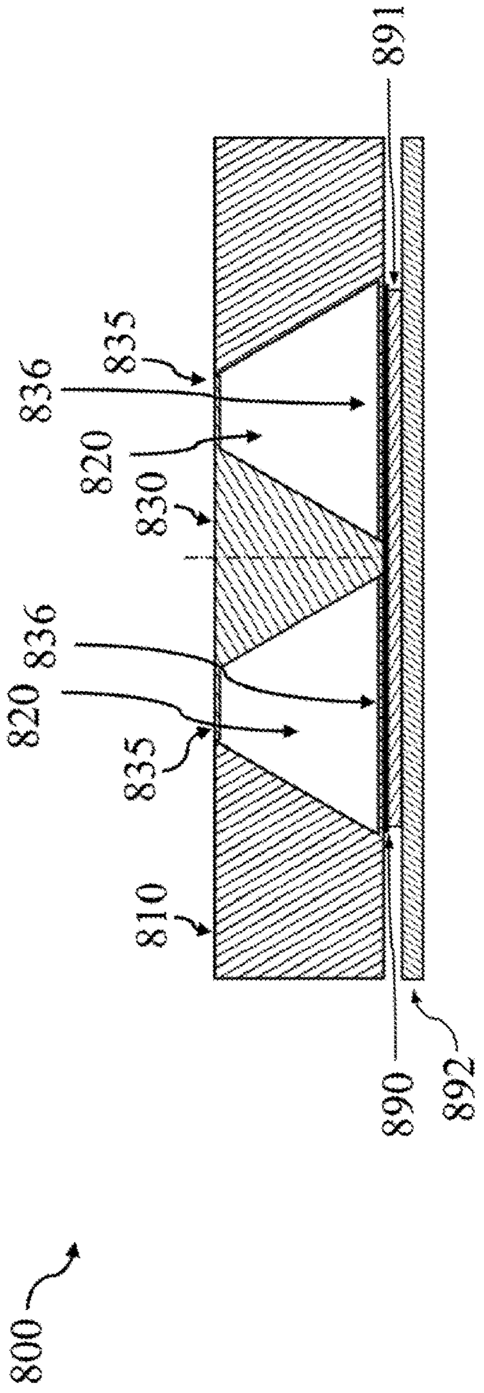
FIG. 8A illustrates a cross-section view of a heat exchanger without flexing, according to an embodiment of the present invention.

FIG. 8A illustrates a cross-section view of a heat exchanger 800 without flexing, according to an embodiment of the present invention. The heat exchanger 800 comprises a base plate 810, an inflexible element 830 with a first flexible element 835 and a second flexible element 836. The combined elements create a cavity 820. The heat exchanger 800 can be attached to a heat source 891 by a thermal interface 890. The heat source 891 can be part of a package or on top of a substrate 892.

Figure 8B:
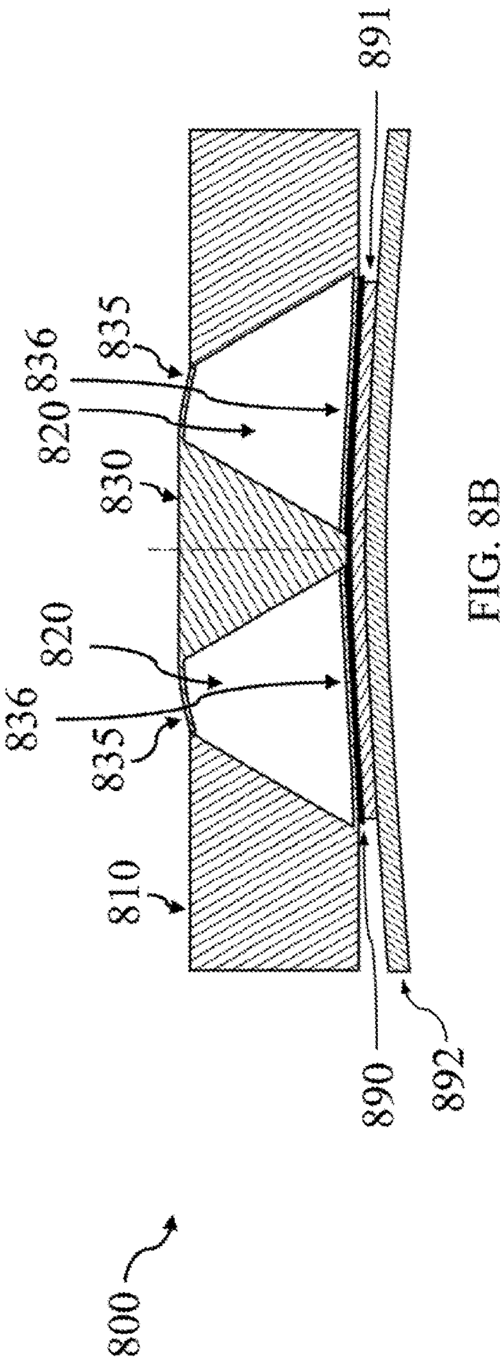
FIG. 8B illustrates a cross-section view of a heat exchanger with flexing, according to an embodiment of the present invention.

FIG. 8B illustrates a cross-section view of a heat exchanger 800 with flexing, according to an embodiment of the present invention. Here, the second flexible element 836 is able to conform to the curve of the thermal interface 890. At the top, the first flexible element 835 also bends.

Figure 9A:
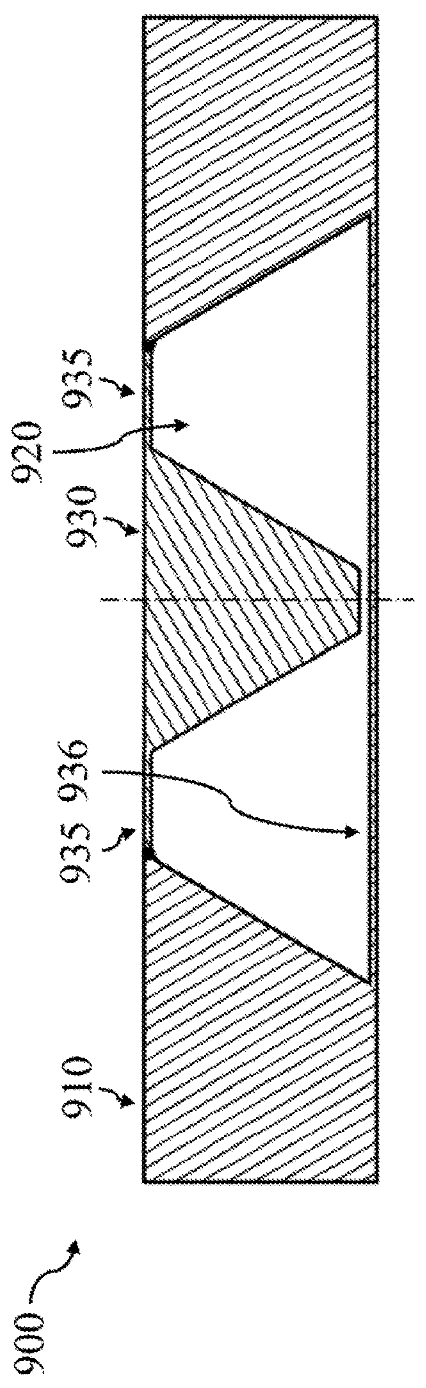
FIG. 9A illustrates a cross-section view of a heat exchanger before attachment, according to an embodiment of the present invention.

FIG. 9A illustrates a cross-section view of a heat exchanger 900 before attachment, according to an embodiment of the present invention. The heat exchanger 900 comprises a base plate 910, an inflexible element 930 with first flexible element 935 and second flexible element 936. The combined elements create a single cavity 920, and in this example, the inflexible element 930 does not extend into the base at the bottom.

Figure 9B:
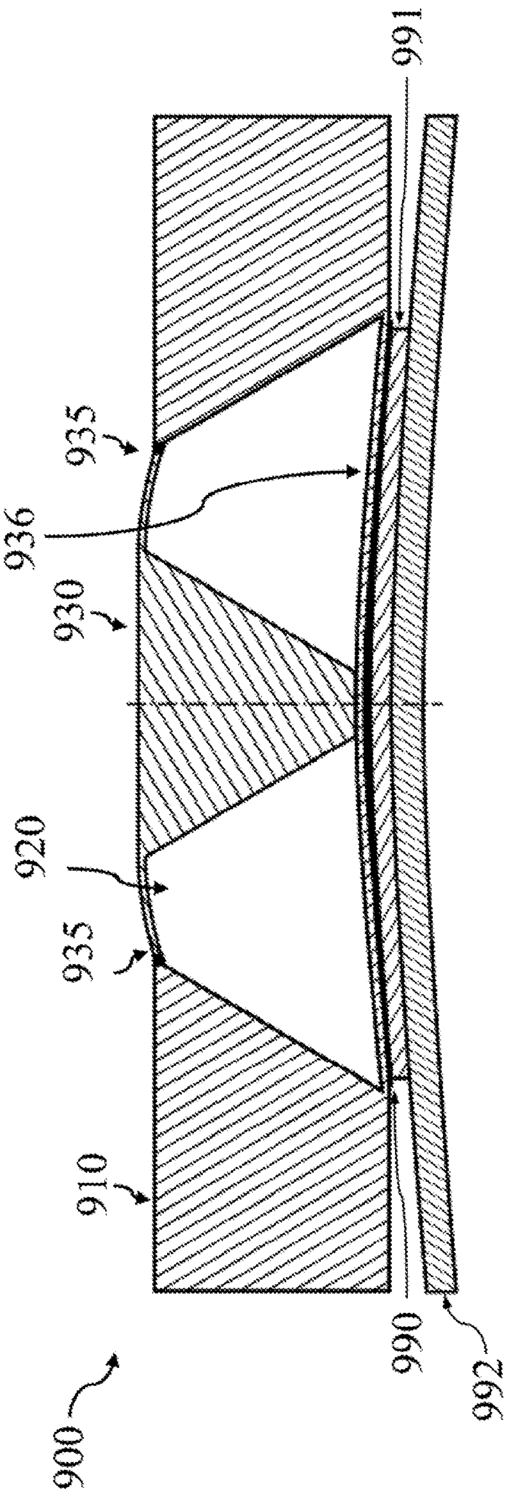
FIG. 9B illustrates a cross-section view of a heat exchanger after attachment, according to an embodiment of the present invention.

FIG. 9B illustrates a cross-section view of a heat exchanger after attachment, according to an embodiment of the present invention. Here, the thermal interface 990, heat source 991, and substrate 992 have been added. The thermal interface 990, heat source 991, and substrate 992 have a curvature. When the heat exchanger 900 is attached, the second flexible element 936 pushes up into the inflexible element 930 at the bottom, thus connecting the inflexible element 930 and the flexible element 936.

Figure 10:
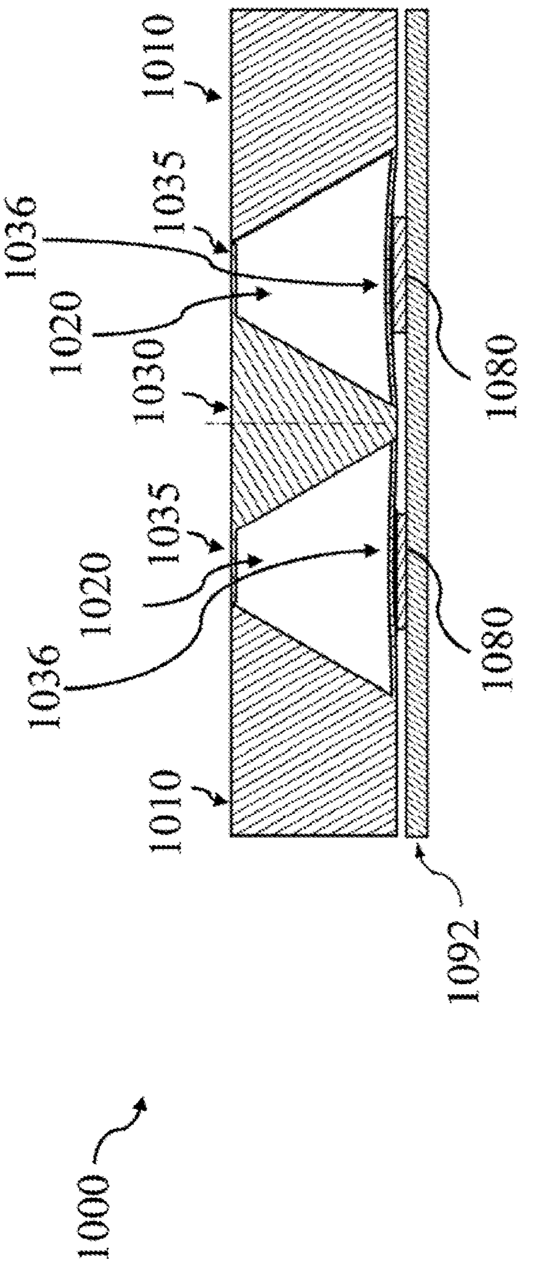
FIG. 10 illustrates a cross-section view of a heat exchanger with multiple heat source elements, according to an embodiment of the present invention.

FIG. 10 illustrates a cross-section view of a heat exchanger with multiple heat source elements 1080, according to an embodiment of the present invention. The heat exchanger 1000 comprises a base plate 1010, an inflexible element 1030 with first flexible element 1035 and second flexible element 1036. The combined elements create a cavity 1020. A heat source 1080 connects to the second flexible element 1036 by a thermal interface. The heat sources 1080 are connected to a substrate 1092.

Figure 11:
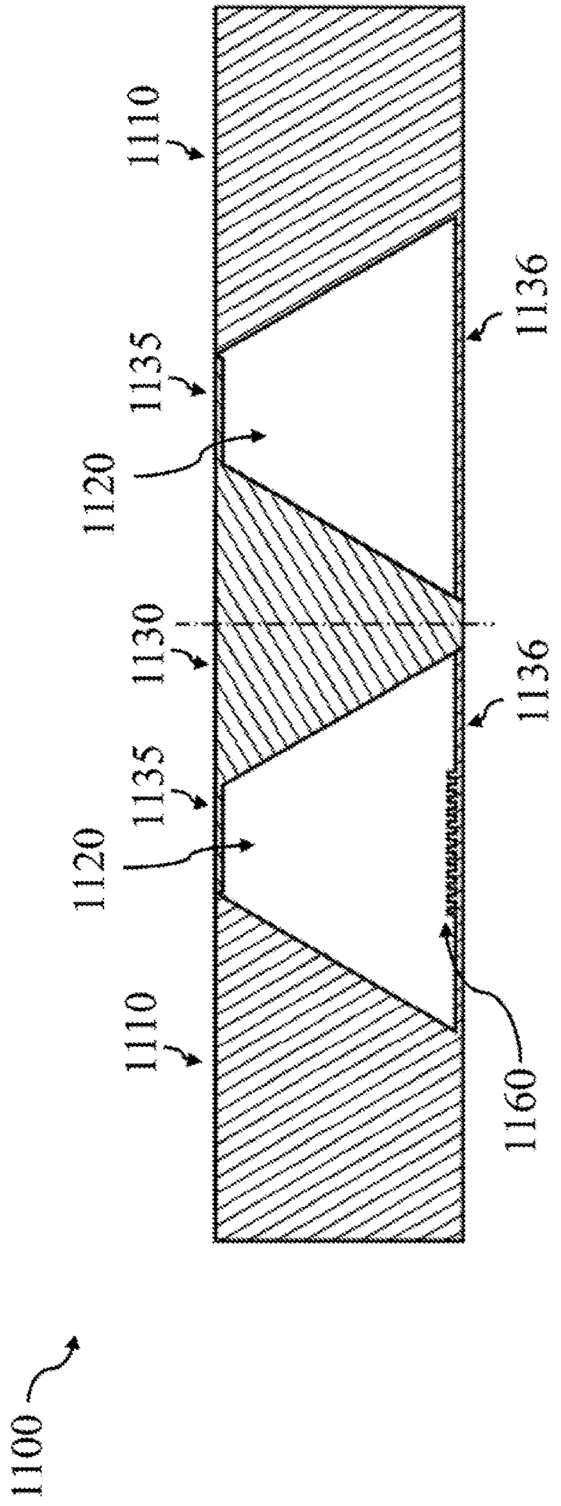
FIG. 11 illustrates a cross-section view of a heat exchanger with a surface enhancing element, according to an embodiment of the present invention.
Figure 12:
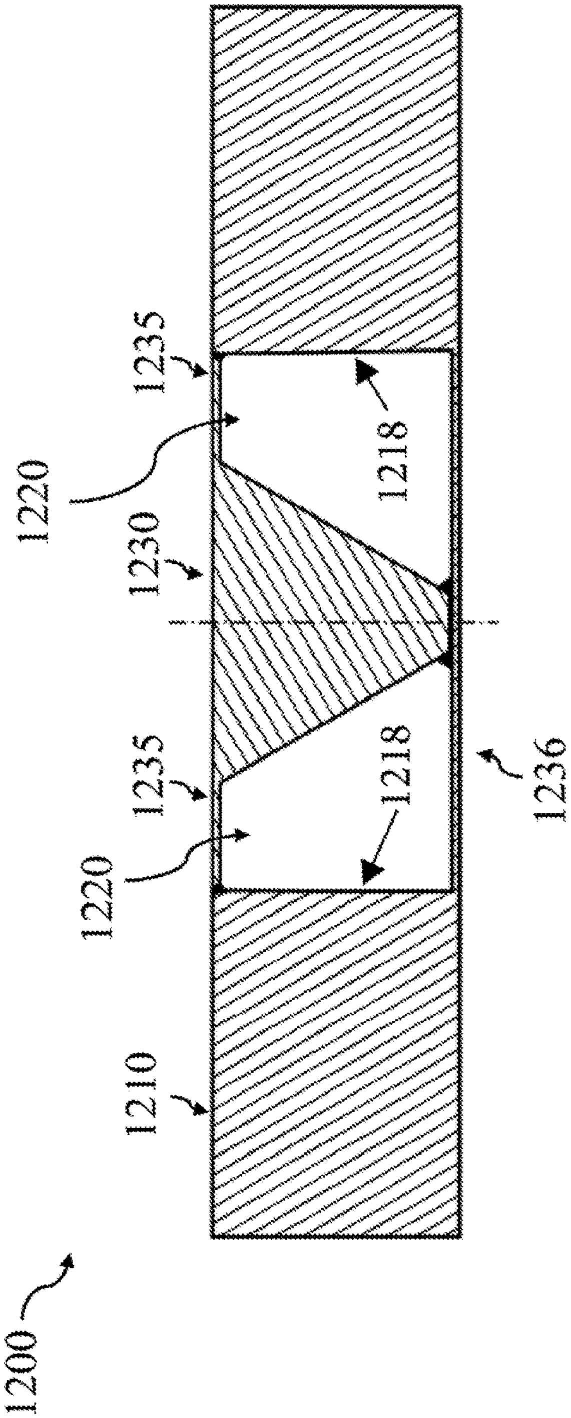
FIG. 12 illustrates a cross-section view of a heat exchanger, according to an embodiment of the present invention.

FIG. 11 illustrates a cross-section view of a heat exchanger 1100 with a surface enhancing element 1160, according to an embodiment of the present invention. The heat exchanger 1100 comprises a base plate 1110, an inflexible element 1130, a first flexible element 1135, and a second flexible element 1136. The combined elements create a cavity 1120. A surface enhancing element 1160 is added to increase the transfer of heat. The surface enhancing elements are made of a good thermal conductor, such as copper and its alloys, aluminum and its alloys, titanium and its alloys, graphite, graphene, or diamond, FIG. 12 illustrates a cross-section view of a heat exchanger 1200, according to an embodiment of the present invention. The base plate 1210 is attached, via the second flexible element 1236, to the inflexible element 1230 at the bottom. The base plate 1210 attaches to the first flexible element 1235. The combined elements create a cavity 1220. Note that in this construction, two of the interior surfaces 1218 of the base plate 1210 are vertical.

Figure 13:
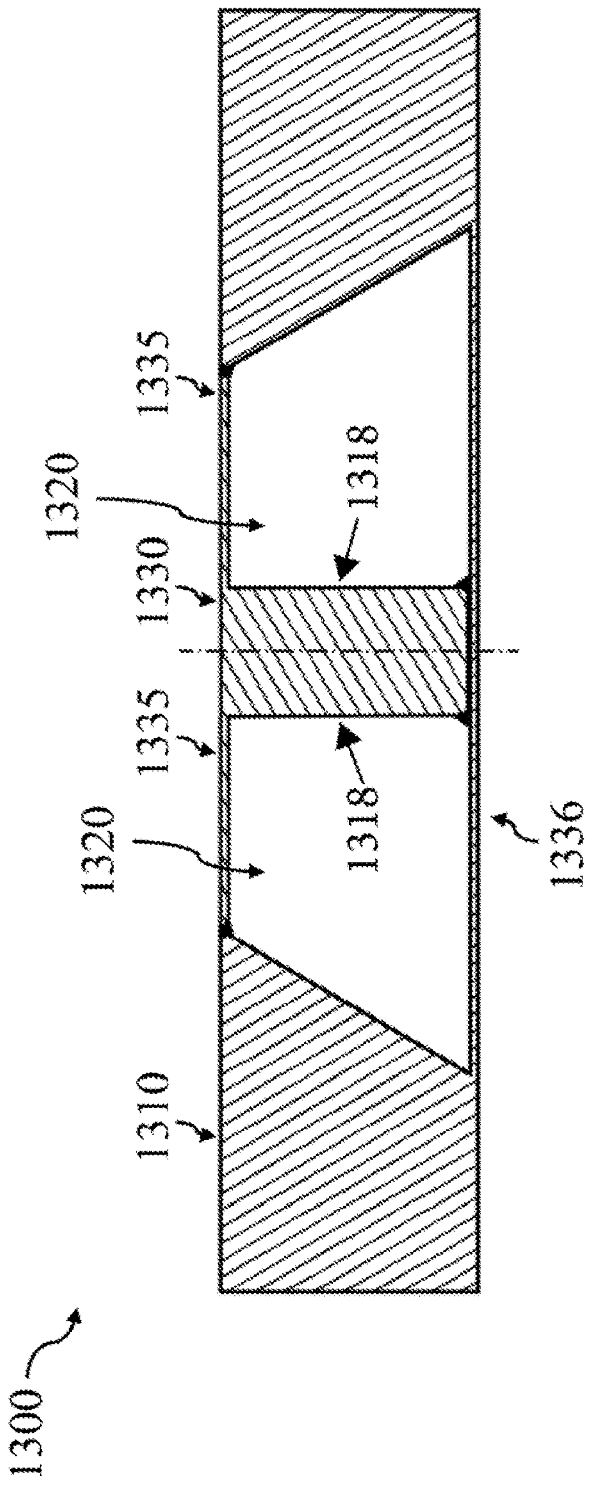
FIG. 13 illustrates a cross-section view of a heat exchanger, according to an embodiment of the present invention.

FIG. 13 illustrates a cross-section view of a heat exchanger 1300, according to an embodiment of the present invention. As in FIG. 12, the base plate 1310 is attached, via bottom flexible element 1336, to the inflexible element 1330 at the bottom. The base plate 1310 attaches to the top flexible element 1335. The combined elements create a cavity 1320. Note that in this construction, two surfaces 1318 of the inflexible element 1330 are vertical.

Figure 14:
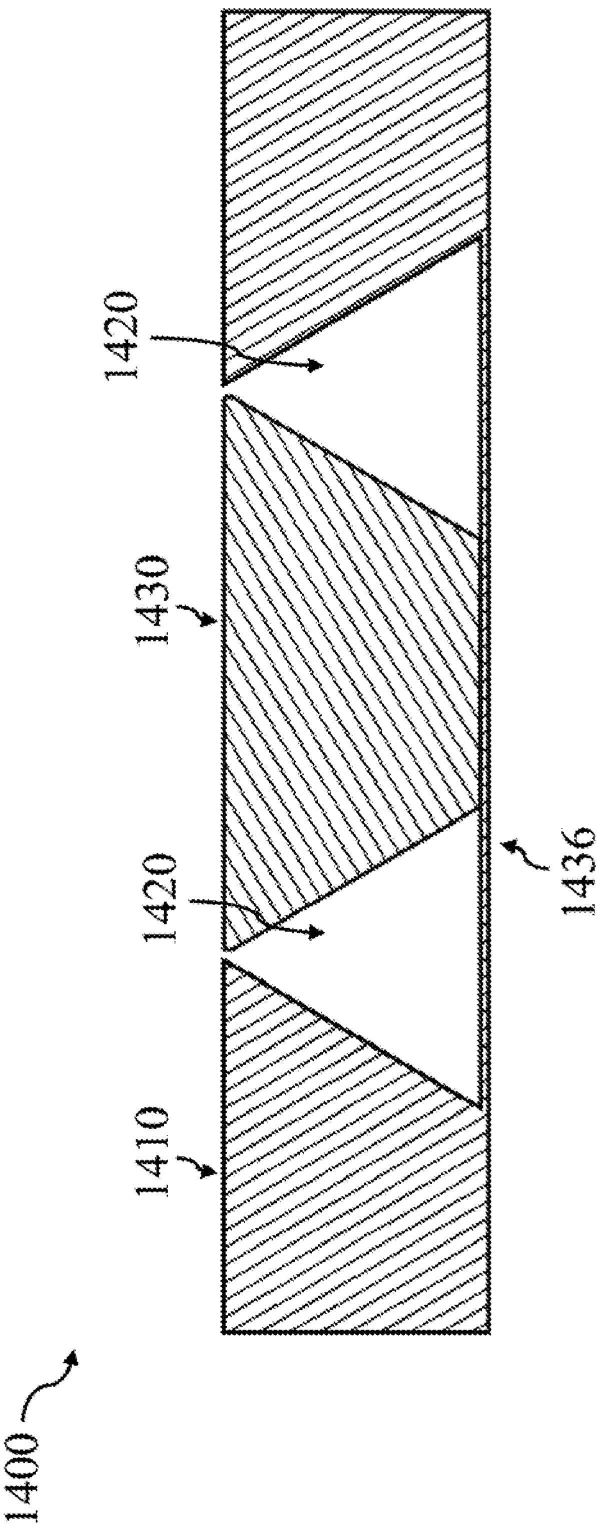
FIG. 14 illustrates a cross-section view of a heat exchanger with a wide inflexible element, according to an embodiment of the present invention.

FIG. 14 illustrates a cross-section view of a heat exchanger 1400 with a wide inflexible element, according to an embodiment of the present invention. In this embodiment, there is a wide inflexible element 1430, and there is only one flexible element 1436. A cavity 1420 is still formed by the surrounding base 1410, the inflexible element 1430 and the flexible element 1436.

Figure 15:
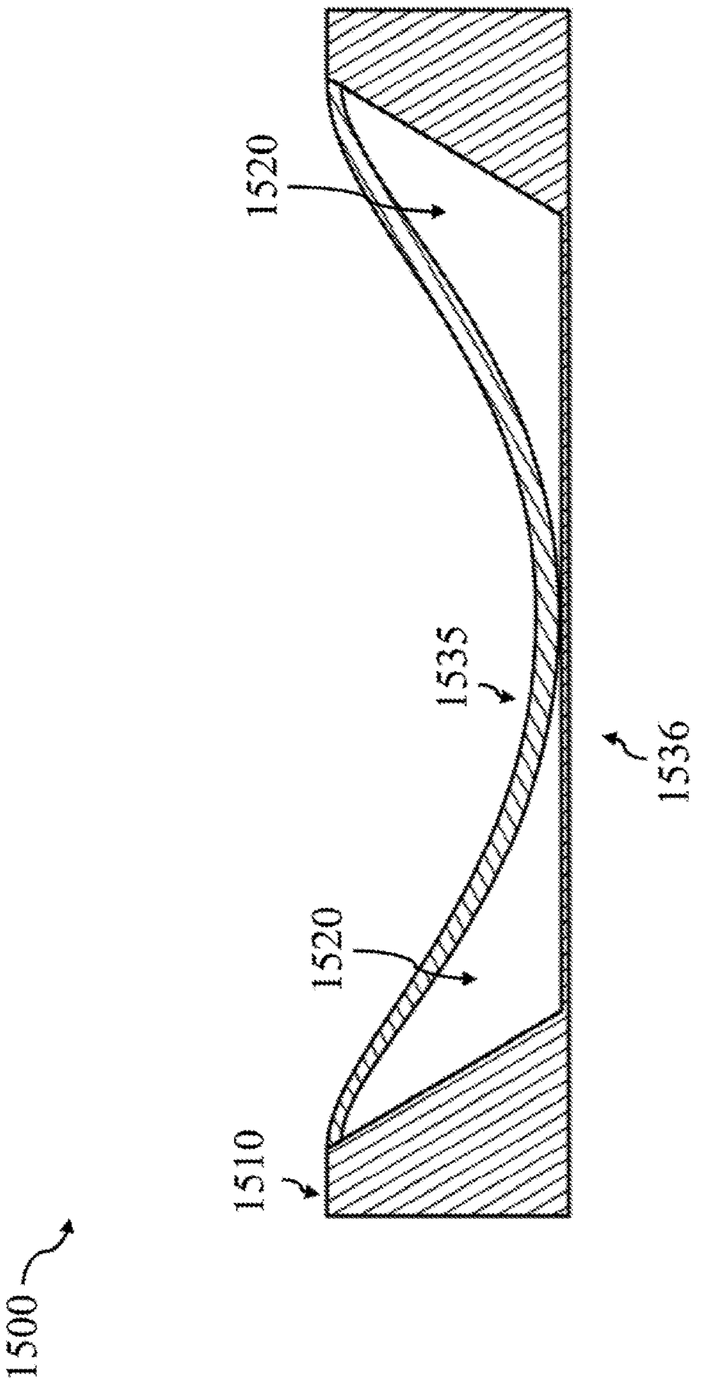
FIG. 15 illustrates a cross-section view of a heat exchanger with no inflexible element, according to an embodiment of the present invention.

FIG. 15 illustrates a cross-section view of a heat exchanger 1500 with no inflexible element, according to an embodiment of the present invention. In this configuration, there are two flexible elements 1535, 1536, and cavity 1520 is formed between the flexible elements 1535, 1536. It is noted that there is no inflexible element in this example. The heat exchanger 1500 comprises a base plate 1510, and the first flexible element 1535 spans most of the width of the heat exchanger 1500. Both of the flexible elements are connected to the base plate 1510. The first flexible element 1535 may touch the second flexible element 1536 in the middle.

Figure 16:
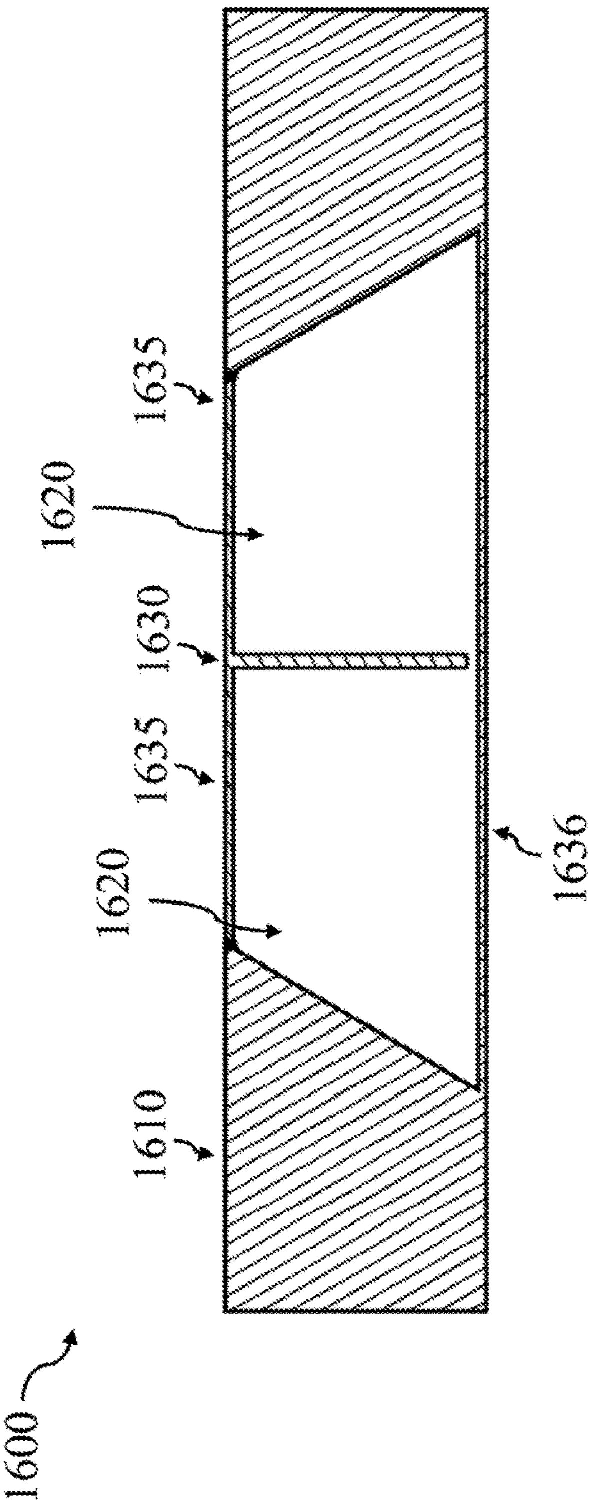
FIG. 16 illustrates a cross-section view of a heat exchanger with narrow inflexible element, according to an embodiment of the present invention.

FIG. 16 illustrates a cross-section view of a heat exchanger 1600 with narrow inflexible element 1630, according to an embodiment of the present invention. The heat exchanger 1600 comprises a base plate 1610, an inflexible element 1630, a first flexible element 1635, and a second flexible element 1636. The combined elements create a cavity 1620. In this configuration, the inflexible element 1630 is very narrow. The inflexible element 1630 may be an elongated cylinder or other such narrow shape.

Figure 17:
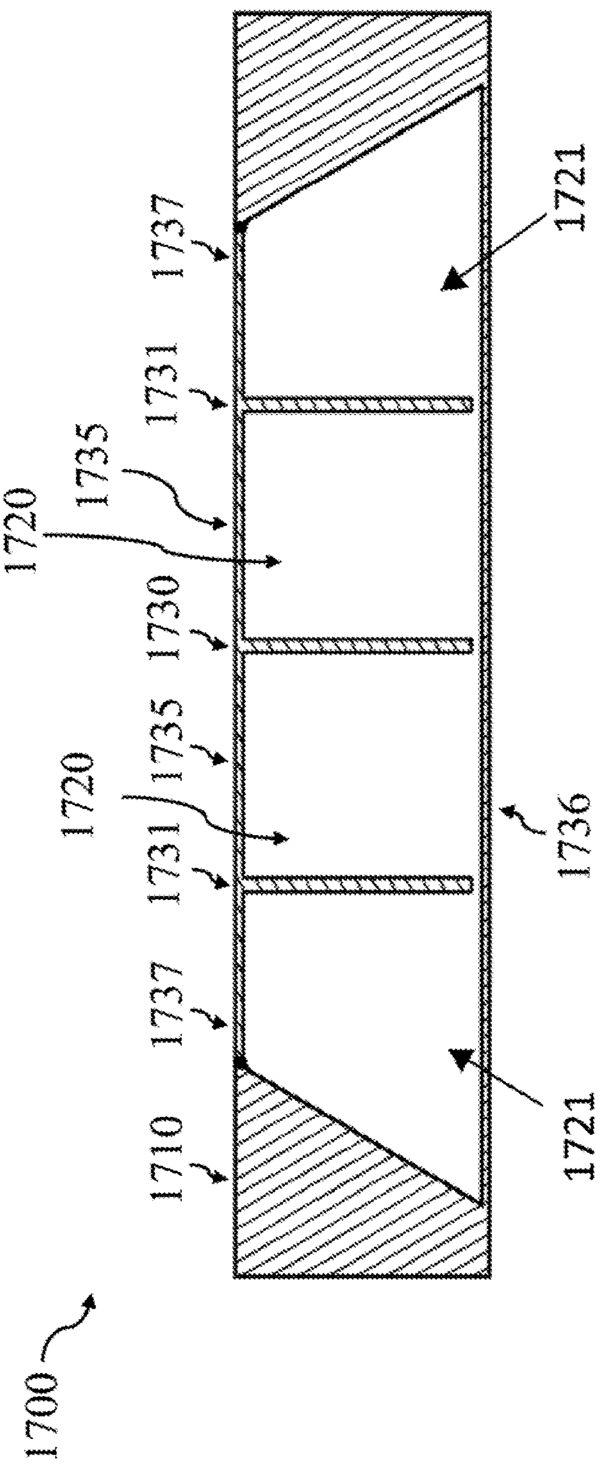
FIG. 17 illustrates a cross-section view of a heat exchanger with multiple inflexible elements, providing multiple cavities, according to an embodiment of the present invention.

FIG. 17 illustrates a cross-section view of a heat exchanger 1700 with multiple inflexible elements, providing multiple cavities, according to an embodiment of the present invention. The heat exchanger 1700 comprises a base plate 1710, a first inflexible element 1730, a second inflexible element 1731, a first flexible element 1735, a second flexible element 1736, and a third flexible element 1737. In this configuration, there may be multiple inflexible elements 1730, 1731, providing multiple cavities 1720, 1721. Although two such cavities are shown, the heat exchanger may be configured to have any number. Similarly, the number of inflexible elements can be increased.

FIG. 18 shows a plot 1800 of the measured deflection behavior in an embodiment of the present invention. As a way of experimental verification, the deflection behavior was measured for the embodiment depicted in FIG. 3. 300 μm thick membranes were used. The element was subjected to a central force load. The line 1801 shows the calibrated deflection curve. For a typical LGA activation load the 300 μm thick membrane deflects about 200 μm, which is in the relevant range of applications.

Figure 19B:
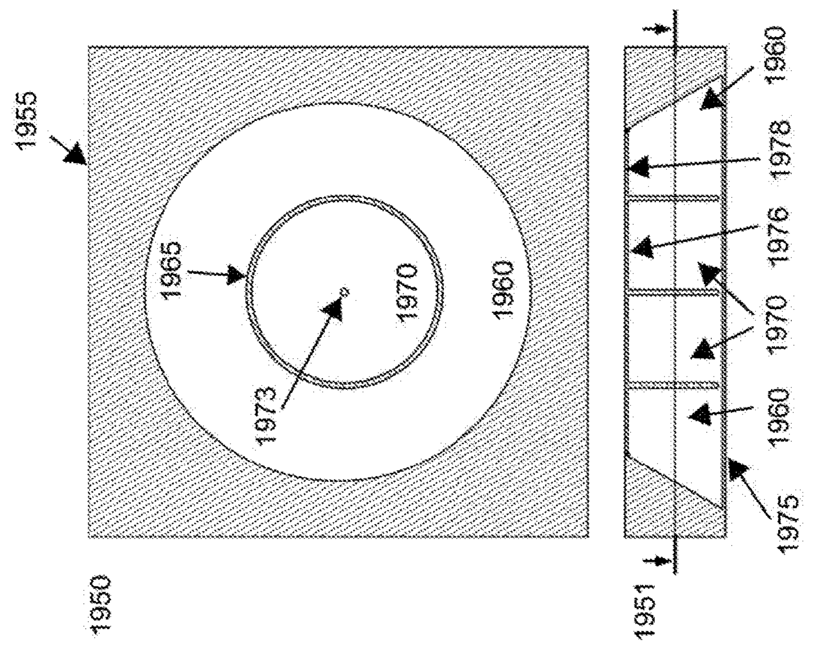
FIGS. 19A and 19B show top-perspective cross-sectional views of heat exchangers, according to an example embodiments. Other features of the present embodiments will be apparent from the Detailed Description that follows.
Figure 19A:
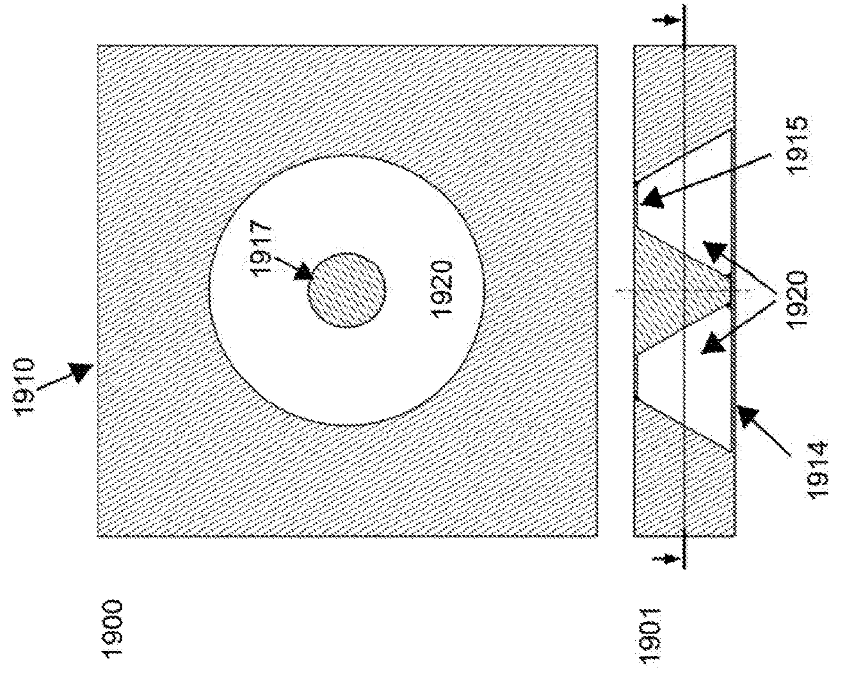

FIGS. 19A and 19B show horizontal and vertical cross-sectional views of heat exchangers according to example embodiments. In particular, FIG. 19A shows a horizontal cross-sectional view 1900 and corresponding vertical cross-sectional view 1901 of the heat exchanger having a single cavity. The heat exchanger in FIG. 19A may correspond to, for example, heat exchanger 500 from FIG. 5 or the heat exchanger 600 from FIG. 6. In this example, the heat exchanger 1900 includes a chamber 1920 which is formed by the base plate 1910, inflexible element 1917, and the flexible elements 1914, 1915.

In particular, FIG. 19B shows a horizontal cross-sectional view 1950 and corresponding vertical cross-sectional view 1951 of a heat exchanger having two cavities. The heat exchanger show in FIG. 19B may correspond to, for example, heat exchanger 1700 from FIG. 17. In this example, the heat exchanger has two chambers 1960, 1970. The heat exchanger includes a base plate 1955; two inflexible elements 1965, 1973; and three flexible elements 1975, 1976, 1978. An example embodiment may be provided in an apparatus for heat exchange, wherein the apparatus includes: a base plate; a first flexible element connected to the base plate; and at least one cavity; wherein the at least one cavity is confined by the flexible element, and the base plate.

The apparatus may include a second flexible element connected to the base plate. The apparatus may further include an inflexible element connected to the first flexible element. The inflexible element may be connected to the second flexible element by a bonding element. The inflexible element may have a shape that is selected from the group consisting of a block, a cylinder, a cone, a dome, a pyramid, and a prism. The cavity may be sealed. The cavity may contain a fluid. The fluid may be selected from the group consisting of acetone, hexane-n, ethanol, methanol, isopropyl alcohol, n-propyl alcohol, cyclohexane, acetaldehyde, diethyl ether, and pentane-n. A surface of a wall of the at least one cavity is enlarged in surface area. The wall may correspond to at least one of: a flexible element (such as shown in FIG. 11 for example), an inflexible element (such as shown in FIG. 13), or the base plate (such as shown in FIG. 12 for example). The surface of the wall may include a roughened surface. The apparatus may include at least one fin structure connected to the base plate. The apparatus may include at least one pin structure connected to the base plate.

According to another example embodiment, a method is provided for providing a heat sink to a non-uniform chip plane, the method including providing a multi-chip device having a non-uniform chip plane; and providing a heat exchanger attached to the multi-chip device, wherein the heat exchanger comprises a base plate, a first flexible element connected to the base plate, an inflexible element connected to the first flexible element, a second flexible element connected to the base plate, and at least one cavity, wherein the at least one cavity is confined by the first flexible element, the second flexible element, the inflexible element, and the base plate.

According to another example embodiment, an electronic module may include: a substrate having a component surface; a plurality of semiconductor chips mounted on the component surface of the substrate; and a heat exchanger attached to the multi-chip device, wherein the heat exchanger comprises a base plate, a first flexible element connected to the base plate, a second flexible element connected to the base plate, an inflexible element connected to the first flexible element, and at least one cavity, wherein the at least one cavity is confined by the first flexible element, the second flexible element, the inflexible element, and the base plate.

The inflexible element may have a shape that is selected from the group consisting of a block, a cylinder, a cone, a pyramid, and a prism. The cavity may be sealed. The cavity may contain a fluid. The fluid may be selected from the group consisting of acetone, hexane-n, ethanol, methanol, isopropyl alcohol, n-propyl alcohol, cyclohexane, acetaldehyde, diethyl ether, and pentane-n. The electronic module may include at least one fin structure connected to the base plate. A surface of a wall of the at least one cavity may be enlarged in surface area.

The various separated components in the disclosure can be connected using various means. For example, solder can be used to combine the elements or reinforce attachment points. In other embodiments, glue can be used. In further embodiments, the components can be crimped or otherwise mechanically attached.

The various cross-section views can be used to construct devices of various shapes. For example, the cross-sections can be rotated to create circularly shaped heat exchangers. Other shapes are possible also, such as rectangular constructions.

While the foregoing written description of the invention enables one of ordinary skill to make and use what is considered presently to be the best mode thereof, those of ordinary skill will understand and appreciate the existence of alternatives, adaptations, variations, combinations, and equivalents of the specific embodiment, method, and examples herein. Those skilled in the art will appreciate that the within disclosures are exemplary only and that various modifications may be made within the scope of the present invention. In addition, while a particular feature of the teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings will be apparent to those skilled in the art from consideration of the specification and practice of the teachings disclosed herein. The invention should therefore not be limited by the described embodiment, method, and examples, but by all embodiments and methods within the scope and spirit of the invention. Accordingly, the present invention is not limited to the specific embodiments as illustrated herein, but is only limited by the following claims.

What is claimed is:

1. An apparatus for heat exchange comprising:
a base plate;
a first flexible element connected to the base plate; and
at least one sealed cavity;
wherein an inner surface of the at least one sealed cavity is formed at least by the first flexible element and the base plate and wherein the first flexible element and the base plate are directly connected;
further comprising an inflexible element connected to the first flexible element, and wherein the inflexible element is connected to a second flexible element by a bonding element, wherein the second element is connected to the base plate.

2. The apparatus of claim 1, wherein the inflexible element has a shape that is selected from the group consisting of a block, a cylinder, a cone, a dome, a pyramid, and a prism.

3. The apparatus of claim 1, wherein the at least one sealed cavity contains a fluid.

4. The apparatus of claim 3, wherein the fluid is selected from the group consisting of acetone, hexane-n, ethanol, methanol, isopropyl alcohol, n-propyl alcohol, cyclohexane, acetaldehyde, diethyl ether, and pentane-n.

5. The apparatus of claim 1, wherein a surface of a wall of the at least one sealed cavity is enlarged in surface area.

6. The apparatus of claim 5, wherein the surface of the wall comprises a roughened surface.

7. The apparatus of claim 6, further comprising at least one fin structure connected to the base plate.

8. The apparatus of claim 7, further comprising at least one pin structure connected to the base plate.

9. A method for providing a heat sink to a non-uniform chip plane, the method comprising:

providing a multi-chip device having a non-uniform chip plane; and providing a heat exchanger attached to the multi-chip device, wherein the heat exchanger comprises a base plate, a first flexible element connected to the base plate, an inflexible element connected to the first flexible element, a second flexible element connected to the base plate, and at least one sealed cavity, wherein an inner surface of the at least one sealed cavity is formed by at least the first flexible element, the second flexible element, the inflexible element, and the base plate, wherein the inflexible element is connected to the second flexible element by a bonding element, wherein the second element is connected to the base plate.

10. An electronic module comprising:

a substrate having a component surface;

a plurality of semiconductor chips mounted on the component surface of the substrate; and a heat exchanger attached to a multi-chip device, wherein the heat exchanger comprises a base plate, a first flexible element connected to the base plate, a second flexible element connected to the base plate, an inflexible element connected to the first flexible element, and at least one sealed cavity, wherein an inner surface of the at least one sealed cavity is formed at least by the first flexible element, the second flexible element, the inflexible element, and the base plate, and wherein the inflexible element is connected to the second flexible element by a bonding element, wherein the second element is connected to the base plate.

11. The electronic module of claim 10, wherein the inflexible element has a shape that is selected from the group consisting of a block, a cylinder, a cone, a pyramid, and a prism.

12. The electronic module of claim 10, wherein the at least one sealed cavity contains a fluid.

13. The electronic module of claim 12, wherein the fluid is selected from the group consisting of acetone, hexane-n, ethanol, methanol, isopropyl alcohol, n-propyl alcohol, cyclohexane, acetaldehyde, diethyl ether, and pentane-n.

14. The electronic module of claim 10, further comprising at least one fin structure connected to the base plate.

15. The electronic module of claim 10, wherein a surface of a wall of the at least one sealed cavity is enlarged in surface area.

* * * * *